United States Patent
Shimizu et al.

(10) Patent No.: US 8,120,388 B2
(45) Date of Patent: *Feb. 21, 2012

(54) COMPARATOR, SAMPLE-AND-HOLD CIRCUIT, DIFFERENTIAL AMPLIFIER, TWO-STAGE AMPLIFIER, AND ANALOG-TO-DIGITAL CONVERTER

(75) Inventors: Yasuhide Shimizu, Nagasaki (JP);
Shigemitsu Murayama, Nagasaki (JP);
Yukitoshi Yamashita, Nagasaki (JP);
Junji Toyomura, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/624,270

(22) Filed: Jan. 18, 2007

(65) Prior Publication Data
US 2007/0152722 A1    Jul. 5, 2007

Related U.S. Application Data

(62) Division of application No. 10/818,776, filed on Apr. 6, 2004, now Pat. No. 7,215,159.

(30) Foreign Application Priority Data

Apr. 9, 2003    (JP) ............................ P2003-105688

(51) Int. Cl.
*H03K 5/22* (2006.01)
*G11C 27/02* (2006.01)
(52) U.S. Cl. ................. 327/77; 327/81; 327/91; 327/93
(58) Field of Classification Search .................. None
See application file for complete search history.

(56) References Cited

U.S. PATENT DOCUMENTS

| | | | | |
|---|---|---|---|---|
| 4,179,472 A * | 12/1979 | Cobb | ............................. | 585/452 |
| 4,760,287 A * | 7/1988 | Goto et al. | ...................... | 327/63 |
| 5,041,744 A * | 8/1991 | Sakai et al. | ..................... | 327/77 |
| 5,543,794 A * | 8/1996 | Kanzaki | ........................ | 341/161 |
| 5,936,434 A * | 8/1999 | Kumamoto et al. | ............ | 327/77 |
| 6,812,790 B2 * | 11/2004 | Ishihara et al. | ............... | 330/143 |

(Continued)

FOREIGN PATENT DOCUMENTS

JP    54-021102    2/1979

(Continued)

OTHER PUBLICATIONS

Full swing or partial swing complementary metal oxide semiconductor driver, IBM technical disclosure bulletin, Jun. 1996, volumen 39, issue No. 6, p. 37-40.*

(Continued)

*Primary Examiner* — Tuan T Lam
(74) *Attorney, Agent, or Firm* — SNR Denton US LLP

(57) ABSTRACT

A comparator includes a sampling capacitor, a first switching unit which is connected to an input end of the sampling capacitor and which applies an input signal to the input end of the sampling capacitor, a second switching unit which is connected to the input end of the sampling capacitor and which applies a reference signal to the input end of the sampling capacitor, an output transistor connected to an output end of the sampling capacitor in a source follower connection manner or an emitter follower connection manner, and a third switching unit which is connected to an output end of the sampling capacitor and which maintains maintaining a voltage at the output end of the sampling capacitor to be constant. The input signal is compared with the reference signal.

3 Claims, 7 Drawing Sheets

U.S. PATENT DOCUMENTS

| | | | |
|---|---|---|---|
| 6,888,488 B2 * | 5/2005 | Takakusagi et al. | 341/159 |
| 2004/0046598 A1 * | 3/2004 | Fotouhi et al. | 327/321 |

FOREIGN PATENT DOCUMENTS

| JP | 57-202120 | | 12/1982 |
|---|---|---|---|
| JP | 58-166813 | | 10/1983 |
| JP | 61-084110 | | 4/1986 |
| JP | 61-196614 | | 8/1986 |
| JP | 01-138808 | | 5/1989 |
| JP | 02-188028 | | 7/1990 |
| JP | 04-003520 | | 1/1992 |
| JP | 05-172857 | | 7/1993 |
| JP | 5-172857 | * | 7/1993 |
| JP | 6-334497 | * | 12/1994 |
| JP | 07-086910 | | 3/1995 |
| JP | 10-256884 | | 9/1998 |
| JP | 10-341141 | | 12/1998 |
| JP | 2000-174568 | | 6/2000 |
| JP | 2000-259111 | | 9/2000 |
| JP | 2001-077679 | | 3/2001 |

OTHER PUBLICATIONS

Kenji Taniguchi; CMOS analog circuit for beginners; CQ Publication Co., Ltd; Sep. 1, 2005; Third Edition.
Japanese Office Action issued on May 12, 2009 in connection with JP Application No. 2006-201965.
William J. Dally and John W. Poulton; Digital Systems Engineering; Basic edition; Maruzen Co., Ltd.; Mar. 30, 2003.
Takuo Sugano; Integrated Circuit Application Handbook; First Edition; Jun. 30, 1981.
Takeshi Yamaga and Masayoshi Nakane; Operational amplifier application technology readers; First Edition; Aug. 31, 1973.
059002, Mar. 30, 2003.
059003, Mar. 30, 2003.
Japanese Office Action issued on Jun. 3, 2008.

* cited by examiner

COMPARATOR, SAMPLE-AND-HOLD CIRCUIT, DIFFERENTIAL AMPLIFIER, TWO-STAGE AMPLIFIER, AND ANALOG-TO-DIGITAL CONVERTER

RELATED APPLICATION DATA

This application is a divisional of and claims the benefit of priority to U.S. application Ser. No. 10/818,776, now U.S. Pat. No. 7,215,159, filed Apr. 6, 2004, which is incorporated herein by reference to the extent permitted by law. This application also claims the benefit of priority to Japanese Patent Applications P2003-105688, filed Apr. 9, 2003, which is also incorporated herein by reference to the extent permitted by law.

BACKGROUND OF THE INVENTION

1. Field of the Invention

The present invention relates to comparators, sample-and-hold circuits, differential amplifiers, two-stage amplifiers, and analog-to-digital converters.

2. Description of the Related Art

A comparator that compares an input signal and a reference signal has been widely used in various electronic circuits.

As this comparator, a comparator 101 having the structure shown in FIG. 12 is known. In the comparator 101, an input signal $V_{in}$ and a reference signal $V_{ref}$ are applied to the input end of a sampling capacitor 102 through a first switch 103 and a second switch 104. The output end of the sampling capacitor 102 connects to an inverter circuit 107 formed by connecting two transistors 105 and 106 between a power supply VCC and the ground GND, and a third switch 108 is provided between the input and output terminals of the inverter circuit 107 (See, for example, Japanese Unexamined Patent Application Publication No. 10-145195).

In the comparator 101, the voltage of the input signal $V_{in}$ is applied to the input end of the sampling capacitor 102 and a threshold voltage of the inverter circuit 107 is applied to the output end of the sampling capacitor 102 in such a manner that the first and third switches 103 and 108 are initially set to be on and the second switch 104 is set to be off. After that, by setting the first and third switches 103 and 108 to be off and the second switch 104 to be on, the voltage of the reference signal $V_{ref}$ is applied to the input end of the sampling capacitor 102.

When the voltage of the input signal $V_{in}$ is greater than the voltage of the reference signal $V_{ref}$, a voltage at the output end of the sampling capacitor 102 is less than the threshold voltage of the inverter circuit 107, and the inverter circuit 107 outputs a high level (H-level) signal. Alternatively, when the voltage of the input signal $V_{in}$ is less than the voltage of the reference signal $V_{ref}$, the voltage at the output end of the sampling capacitor 102 is greater than the threshold voltage of the inverter circuit 107, and the inverter circuit 107 outputs a low level (H-level) signal.

In the comparator 101, a range of the input signal $V_{in}$ in which the comparator 101 is operable cannot be widened because the inverter circuit 107 is connected to the output end of the sampling capacitor 102.

This is because, in the comparator 101, widening the range of the input signal $V_{in}$ in which the comparator 101 is operable greatly increases power consumption of the comparator 101 and deteriorates characteristics of the comparator 101 since a cutoff frequency of the input signal $V_{in}$ is determined by two transistors 105 and 106 which constitute the inverter circuit 107.

In other words, in the comparator 101, in order to improve frequency characteristics of the transistors 105 and 106, transconductances of the transistors 105 and 106 must be increased. For the purpose, a direct current supplied to the transistors 105 and 106 must be increased, and the power consumption accordingly increases.

Also, in the comparator 101, in order that a large direct current may flow in each transistor 105 or 106, the transistors 105 and 106 must be enlarged. The enlarged transistors 105 and 106 increase their parasitic capacitances, and characteristics of the comparator 101 accordingly deteriorate.

As described above, since, in the comparator 101, the inverter circuit 107 is connected to the output end of the sampling capacitor 102, an increase in power consumption and deterioration in characteristic occur due to widening of the range of the input signal $V_{in}$. As a result, a range of the input signal $V_{in}$ in which the comparator 101 is operable cannot be widened.

SUMMARY OF THE INVENTION

Accordingly, it is an object of the present invention to enable signal range widening for a comparator by employing a configuration that connects an inverter circuit to an output end of a sampling capacitor, and to enable signal range widening for a differential amplifier and analog-to-digital converter by applying the comparator to the differential amplifier and the analog-to-digital converter.

According to an aspect of the present invention, a comparator is provided which includes a sampling capacitor, a first switching unit which is connected to an input end of the sampling capacitor which applies an input signal to the input end of the sampling capacitor, a second switching unit which is connected to the input end of the sampling capacitor and which applies a reference signal to the input end of the sampling capacitor, an output transistor connected to an output end of the sampling capacitor in a source follower connection manner or an emitter follower connection manner, and a third switching unit which is connected to an output end of the sampling capacitor and which maintains a voltage at the output end of the sampling capacitor to be constant. In the comparator, the input signal is compared with the reference signal.

According to another aspect of the present invention, a sample-and-hold circuit is provided which includes a sampling capacitor, a first switching unit which is connected to an input end of the sampling capacitor which applies an input signal to the input end of the sampling capacitor, a second switching unit which is connected to the input end of the sampling capacitor and which applies a reference signal to the input end of the sampling capacitor, an output transistor connected to an output end of the sampling capacitor in a source follower connection manner or an emitter follower connection manner, and a third switching unit which is connected to an output end of the sampling capacitor and which maintains a voltage at the output end of the sampling capacitor to be constant, and in which the input signal is sampled.

According to another aspect of the present invention, a differential amplifier including a pair of comparators differentially connected to each other is provided. Each of the comparators includes a sampling capacitor, a first switching unit which is connected to an input end of the sampling capacitor which applies an input signal to the input end of the sampling capacitor, a second switching unit which is connected to the input end of the sampling capacitor and which applies a reference signal to the input end of the sampling capacitor, an output transistor connected to an output end of the sampling capacitor in a source follower connection manner or an emitter follower connection manner, and a third switching unit which is connected to an output end of the sampling capacitor and which maintains a voltage at the output end of the sampling capacitor to be constant. In each of the comparators, the input signal is compared with the reference signal.

According to another aspect of the present invention, a two-stage amplifier including prestage and poststage amplifiers connected in series to each other is provided. The two-stage amplifier has an offset compressing function for compressing an offset voltage of the prestage amplifier by increasing the gain of the postage amplifier. The prestage amplifier includes a pair of comparators differentially connected to each other. Each of the comparators includes a sampling capacitor, a first switching unit which is connected to an input end of the sampling capacitor which applies an input signal to the input end of the sampling capacitor, a second switching unit which is connected to the input end of the sampling capacitor and which applies a reference signal to the input end of the sampling capacitor, an output transistor connected to an output end of the sampling capacitor in a source follower connection manner or an emitter follower connection manner, and a third switching unit which is connected to an output end of the sampling capacitor and which maintains a voltage at the output end of the sampling capacitor to be constant. In each of the comparators, the input signal is compared with the reference signal.

According to another aspect of the present invention, an analog-to-digital converter including a plurality of comparators is provided. In the analog-to-digital converter, an input signal is converted into digital form after each of the comparators compares the input signal with one reference signal of different reference signals. Each of the comparators includes a sampling capacitor, a first switching unit which is connected to an input end of the sampling capacitor which applies the input signal to the input end of the sampling capacitor, a second switching unit which is connected to the input end of the sampling capacitor and which applies the reference signal to the input end of the sampling capacitor, an output transistor connected to an output end of the sampling capacitor in a source follower connection manner or an emitter follower connection manner, and a third switching unit which is connected to an output end of the sampling capacitor and which maintains a voltage at the output end of the sampling capacitor to be constant. In each of the comparators, the input signal is compared with the reference signal.

According to another aspect of the present invention, a two-stage amplifier including prestage and poststage amplifiers connected in series to each other is provided. The two-stage amplifier has an offset compressing function for compressing an offset voltage of the prestage amplifier by increasing the gain of the postage amplifier. The prestage amplifier includes a pair of comparators differentially connected to each other. Each of the comparators includes a sampling capacitor, a first switching unit which is connected to an input end of the sampling capacitor which applies an input signal to the input end of the sampling capacitor, a second switching unit which is connected to the input end of the sampling capacitor and which applies a reference signal to the input end of the sampling capacitor, an output transistor connected to an output end of the sampling capacitor in a source follower connection manner or an emitter follower connection manner, and a third switching unit which is connected to an output end of the sampling capacitor and which maintains a voltage at the output end of the sampling capacitor to be constant, and the input signal is compared with the reference signal. The comparators include an input-impedance lowering unit provided between the output ends of the sampling capacitors of the comparators.

According to another aspect of the present invention, an analog-to-digital converter including a plurality of comparators is provided. In the analog-to-digital converter, an input signal is converted into digital form after each of the comparators compares the input signal with one reference signal of different reference signals. Each of the comparators includes a sampling capacitor, a first switching unit which is connected to an input end of the sampling capacitor which applies an input signal to the input end of the sampling capacitor, a second switching unit which is connected to the input end of the sampling capacitor and which applies a reference signal to the input end of the sampling capacitor, an output transistor connected to an output end of the sampling capacitor in a source follower connection manner or an emitter follower connection manner, and a third switching unit which is connected to an output end of the sampling capacitor and which maintains a voltage at the output end of the sampling capacitor to be constant, and the input signal is compared with the reference signal. The comparators include an input-impedance lowering unit provided between the output ends of the sampling capacitors of the comparators.

A comparator of the present invention is usable in various electronic circuits. For example, it can be used in an analog-to-digital converter.

According to the present invention, a comparator has a wideband. By using the comparator in a differential amplifier or an analog-to-digital converter, the differential amplifier or analog-to-digital converter can have a wideband.

DESCRIPTION OF THE PREFERRED EMBODIMENTS

Specific embodiments of the present invention are described below with reference to the accompanying drawings.

Figure 1:
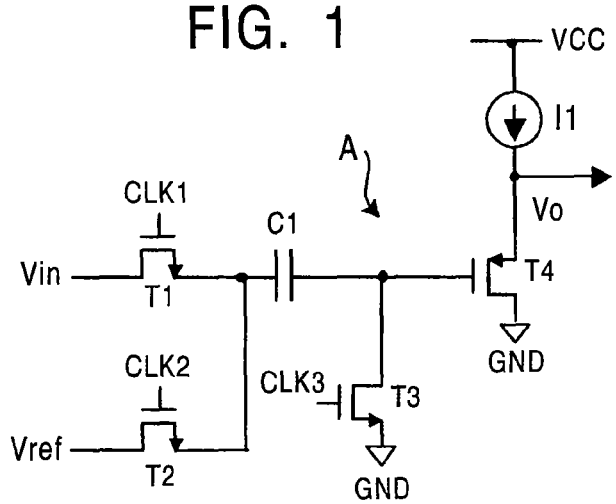
FIG. 1 is a circuit diagram showing a comparator according to an embodiment of the present invention.

As FIG. 1 shows, in a comparator A according to an embodiment of the present invention, an input signal $V_{in}$ is applied to the input end of a sampling capacitor C1 through an N-type switching transistor T1 used as a first switching unit, and a reference signal $V_{ref}$ is applied to the input end of the sampling capacitor C1 through an N-type switching transistor T2 used as a second switching unit.

A first control signal CLK1 is applied to the gate terminal of the switching transistor T1, and a second control signal CLK2 is applied to the gate terminal of the switching transistor T2.

Also, in the comparator A, the gate terminal of a P-type output transistor T4 is connected in a source follower connection manner to the output end of the sampling capacitor C1, and a switching transistor T3 used as a third switching unit is connected to the output end of the sampling capacitor C1 in order to set a voltage at the output end of the sampling capacitor C1 to be constant (ground voltage).

A third control signal CLK3 is applied to the gate terminal of the switching transistor T3.

An output transistor T4 has a source terminal connected to a power supply VCC, with a constant current generator I1 provided therebetween, and a drain terminal connected to the ground GND. An output signal can be extracted from the source terminal.

Figure 2:
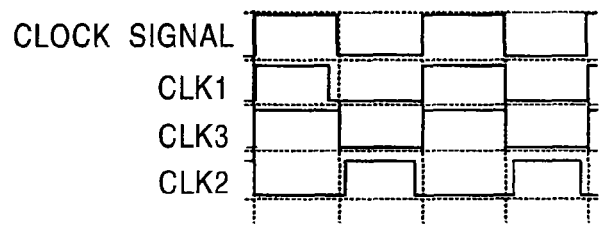
FIG. 2 is a timing chart showing control signal timing.

The comparator A is controlled by the first to third control signals CLK1, CLK2, and CLK3, which change with the timing shown in FIG. 2. The voltage of the input signal $V_{in}$ is applied to the input end of the sampling capacitor C1 by using the first and third control signals CLK1 and CLK3 to set the transistors T1 and T3 to be on, and using the second control signal CLK2 to set the switching transistor T2 to be off. The input signal $V_{in}$ is sampled with a constant voltage (ground voltage) applied to the output end of the sampling capacitor C1. After that, the switching transistors T1 and T3 are set to be off by using the first and third control signals CLK1 and CLK3, and the switching transistor T2 is set to be on by using the second control signal CLK2, whereby the voltage of the reference signal $V_{ref}$ is applied to the input end of the sampling capacitor C1. In this state, the input signal $V_{in}$ and the reference signal $V_{ref}$, which are obtained at the time the third control signal CLK3 changes from its ON state to OFF state, are compared in voltage.

When the input signal $V_{in}$ is greater than the reference signal $V_{ref}$ in voltage, the voltage at the output end of the sampling capacitor C1 drops and a low level (L-level) signal is output. Alternatively, when the input signal $V_{in}$ is less than the reference signal $V_{ref}$, the voltage at the output end of the sampling capacitor C1 rises and an high level (H-level) signal is output.

Accordingly, the comparator A has a sample-and-hold function because the comparator A operates to sample the input signal $V_{in}$ when the third control signal CLK3 is on and to compare the voltages of the input signal $V_{in}$ and the reference signal $V_{ref}$ when the third control signal CLK3 changes into the OFF state.

As described above, in the comparator A according to the embodiment, instead of connecting an inverter circuit to the output end of the sampling capacitor C1, the output transistor T4 is connected in a source follower connection manner or connected in an emitter follower connection manner, whereby frequency characteristics caused by characteristics of the output transistor T4 can be improved and a range of the input signal $V_{in}$ which can be sampled can be determined by the first and third switching units.

Therefore, by reducing an ON resistance of the third switching unit, the sampling range of the comparator A can be widened.

When the switching transistor T3 is used as the third switching unit, by simply enlarging the switching transistor T3, the ON resistance can be easily reduced without increasing a direct current following in the switching transistor T3.

The switching units are not limited to switching transistors, but various switching transistors may be used. Also, the transistors are not field effect transistors, but bipolar transistors may be used. In particular, when a bipolar transistor is used as the output transistor T4, it needs to be connected in an emitter follower connection manner to the sampling capacitor C1.

The third switching unit can be constituted by connecting a plurality of switching transistors in series to one another.

Figure 3:
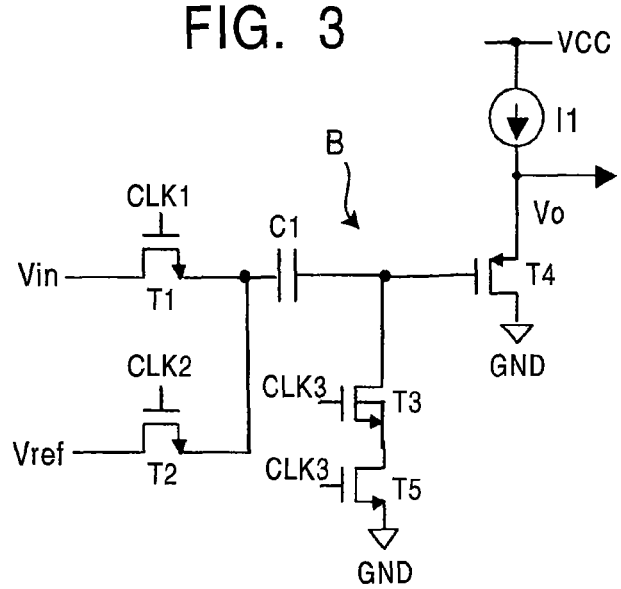
FIG. 3 is a circuit diagram showing a comparator according to another embodiment of the present invention.

In other words, the comparator B shown in FIG. 3 includes two N-type switching transistors T3 and T5 connected in series to each other, as the third switching unit. A second control signal CLK2 is applied to the gate terminals of the switching transistors T3 and T5.

In the present invention, as described above, in the comparator B, also parasitic diodes of the switching transistors T3 and T5 are connected in series since the switching transistors T3 and T5 are connected in series. Accordingly, an opposite current can be prevented from flowing in the third switching unit through the parasitic diodes. This can prevent the comparator B from malfunctioning.

By differentially connecting the above comparators A and B, both (in pair) can be used as a differential amplifier.

Figure 4:
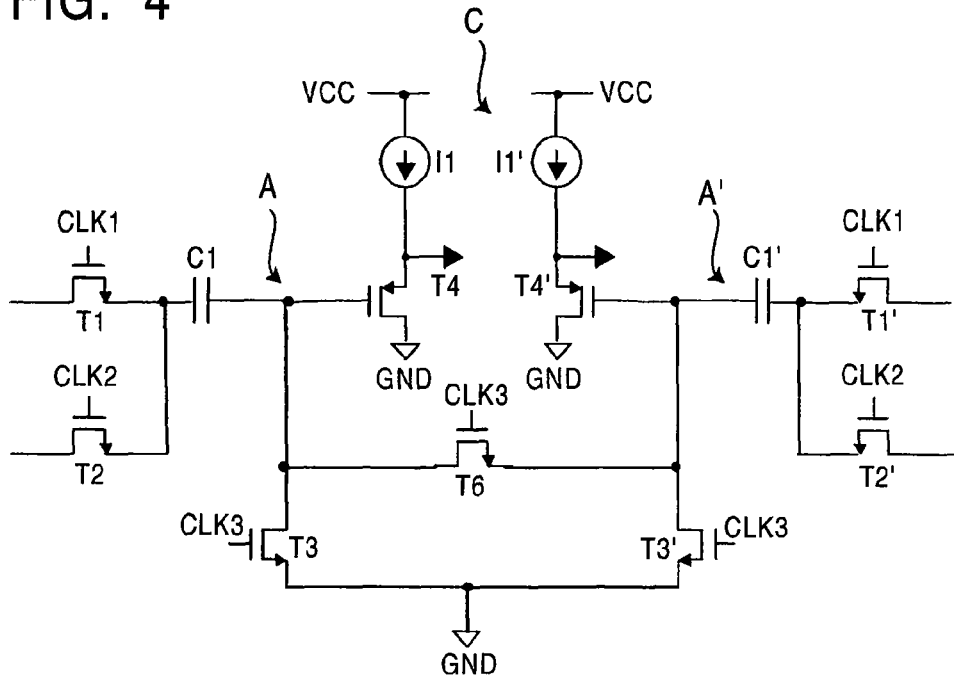
FIG. 4 is a circuit diagram showing a differential amplifier according to an embodiment of the present invention.

Specifically, the differential amplifier C shown in FIG. 4 is formed by differentially connecting a pair of comparators A and A'. Since the comparator A' is similar in structure to the comparator A, primes are put on the reference numerals of elements having identical functions.

In the differential amplifier C, an N-type switching transistor T6 which is controlled to be on and off by a second control signal is provided between a pair of sampling capacitors C1 and C1, whereby a decrease in input impedance is achieved.

Figure 5:
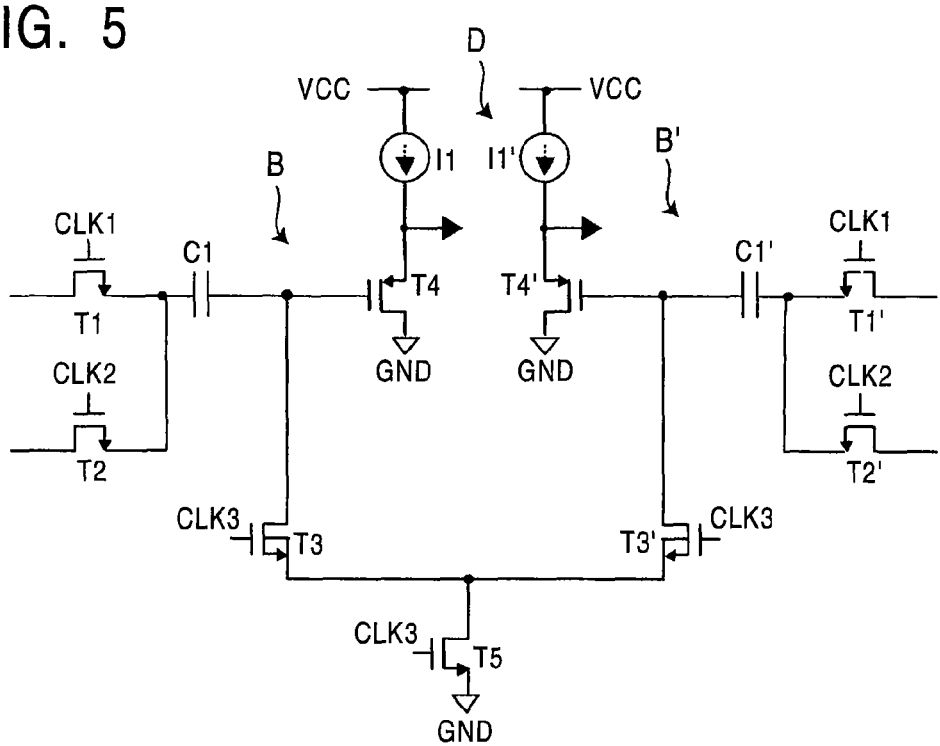
FIG. 5 is a circuit diagram showing a comparator according to another embodiment of the present invention.

The comparator D shown in FIG. 5 is formed by differentially connecting a pair of comparators B and B'. Since the comparator B' is similar in structure to the comparator B, primes are put on the reference numerals of elements having identical functions.

In addition, the above comparators A and B can be built into an analog-to-digital converter.

An embodiment of the present invention in which the above comparators A and B are applied to an analog-to-digital converter is described below.

By way of example, a sub-ranging analog-to-digital converter which has a total of four bits and which converts an analog signal into upper two bits of digital signals and subsequently converts lower two bits of the digital signals is described, but specific embodiments of the present invention are not limited to the sub-ranging analog-to-digital converter.

Figure 6:
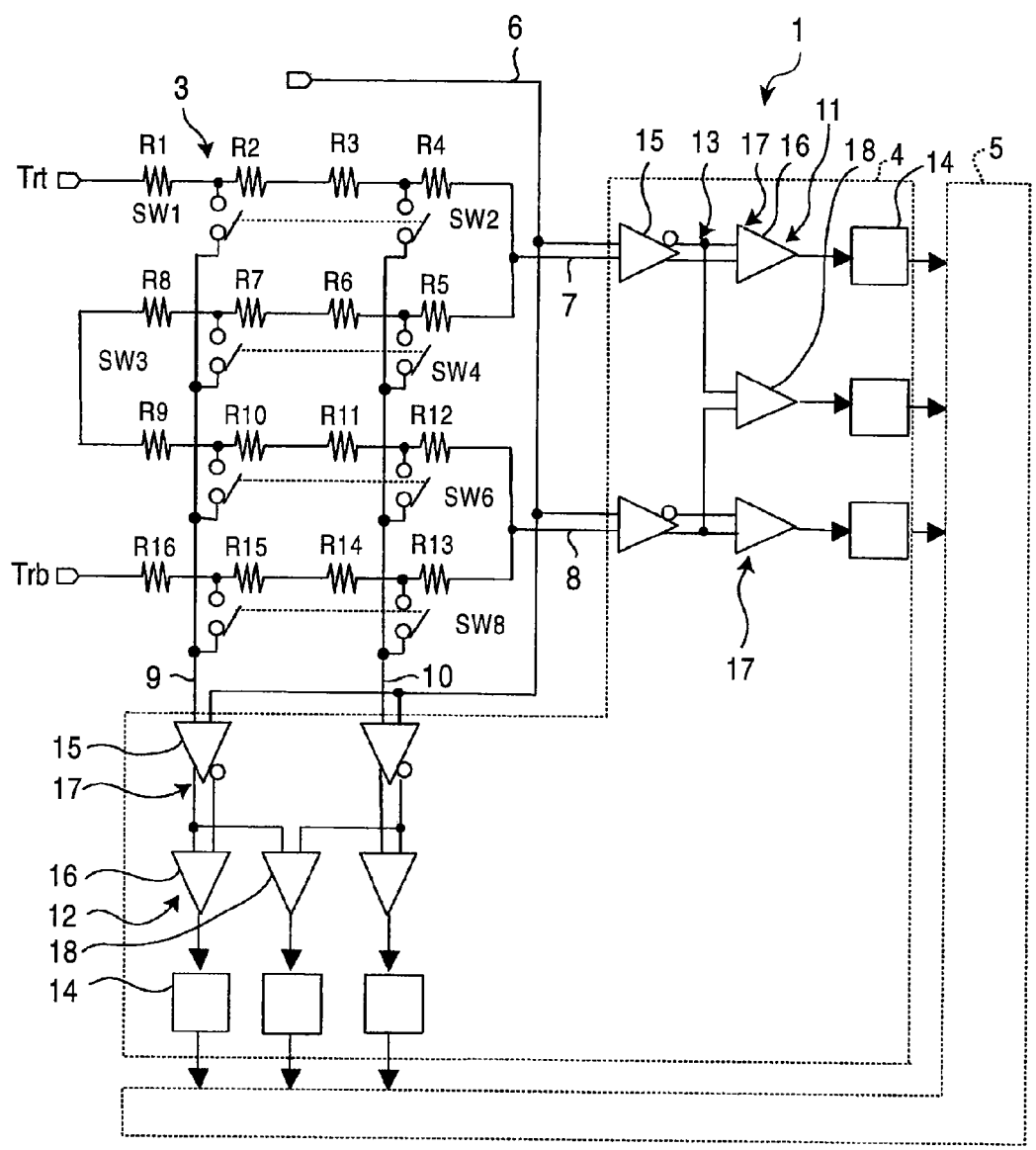
FIG. 6 is a circuit diagram showing an analog-to-digital converter according to an embodiment of the present invention.

As FIG. 6 shows, an analog-to-digital converter 1 according to an embodiment of the present invention includes a reference voltage generating unit 3 for generating a plurality of different reference voltages, a comparing unit 4 for comparing the voltage of the analog signal with the different reference voltages, and a logic processing unit 5 for outputting a digital signal corresponding to the analog signal by performing logic processing on outputs from the comparing unit 4. In the analog-to-digital converter 1, the comparators A and B having the above sample-and-hold function are applied to the comparing unit 4. Thus, a sample-and-hold unit for sampling and holding the analog signal is not provided between an input terminal $T_{in}$ and the hold line 6.

The reference voltage generating unit 3 generates a plurality of reference voltages by using sixteen resistors R1 to R16 which have equal resistances and which are connected in series between a high-side reference power supply $T_{rt}$ for supplying a high side reference potential and a low-side reference power supply $T_{rb}$ for generating a low side reference potential, and dividing the voltage between the high side reference potential and the low side reference potential by using the sixteen resistors R1 to R16. The reference voltages are output from upper-bit reference-signal lines 7 and 8, or from lower-bit reference-signal lines 9 and 10.

Specifically, in the reference voltage generating unit 3, the upper-bit reference-signal lines 7 and 8, which output upper bit reference voltages, are respectively connected to the point between the fourth resistor R4 and fifth resistor R5 from the high-side reference power supply $T_{rt}$ and the point between the fourth resistor R13 and fifth resistor R12 from the low-side reference power supply $T_{rb}$. Switches SW1 and SW2 which cooperatively link the lower-bit reference-signal lines 9 and 10 are respectively connected to the point between the first resistor R1 and second resistor R2 from the high-side reference power supply $T_{rt}$ and to the point between the third resistor R3 and fourth resistor R4 from the high-side reference power supply $T_{rt}$. The lower-bit reference-signal lines 9 and 10 are respectively connected to the point between the seventh resistor R7 and eighth resistor R8 from the high-side reference power supply $T_{rt}$ and to the fifth resistor R5 and sixth resistor R6 from the high-side reference power supply $T_{rt}$ by interlock switches SW3 and SW4. The lower-bit reference-signal lines 9 and 10 are respectively connected to the point between the ninth resistor R9 and tenth resistor R10 from the high-side reference power supply $T_{rt}$ and the point between the eleventh resistor R11 and twelfth resistor R12 from the high-side reference power supply $T_{rt}$ by interlock switches SW5 and SW6. Also, the lower-bit reference-signal lines 9 and 10 are respectively connected to the fifteenth resistor R15 and sixteenth resistor R16 from the high-side reference power supply $T_{rt}$ and to the point between the thirteenth resistor R13 and fourteenth resistor R14 from the high-side reference power supply $T_{rt}$ by interlock switches SW7 and SW8.

When converting the analog signal into upper bit digital signals, the reference voltage generating unit 3 outputs the reference voltages from the upper-bit reference-signal lines 7 and 8, with all the switches SW1 to SW8 turned off. Also, when converting the analog signal into lower bit digital signals, the reference voltage generating unit 3 outputs the reference voltages from the lower-bit reference-signal lines 9 and 10, with any one pair of switches, among pairs of switches SW1 and SW2, SW3 and SW4, SW5 and SW6, and SW7 and SW8, set to be on.

The comparing unit 4 includes an upper bit comparing unit 11 for comparing the voltage of the analog signal with the reference voltages for the upper bits, and a lower bit comparing unit 12 for comparing the voltage of the analog signal with the reference voltages for the lower bits. Since the upper bit comparing unit 11 and the lower bit comparing unit 12 are identical in configuration, the upper bit comparing unit 11 is described below.

The upper bit comparing unit 11 includes an amplification unit 13 for amplifying a difference between the voltage of the analog signal and each reference voltage, and a compare-and-hold unit 14 for comparing and holding the output of the amplification unit 13.

The amplification unit 13 includes two two-stage amplifiers 17 formed by two differential amplifiers 15 and 16 which are connected in series to each other, and a complementary amplifier 18 which is connected to two differential amplifiers 15 before the stage of the two-stage amplifiers 17, which are adjacent to each other, and which differentially amplifies the outputs of the differential amplifiers 15. The two-stage amplifiers 17 are not limited to a case in which the two differential amplifiers 15 and 16 are connected in series to each other, but can be also formed by three or more differential amplifiers which are connected in series to one another.

Figure 7:
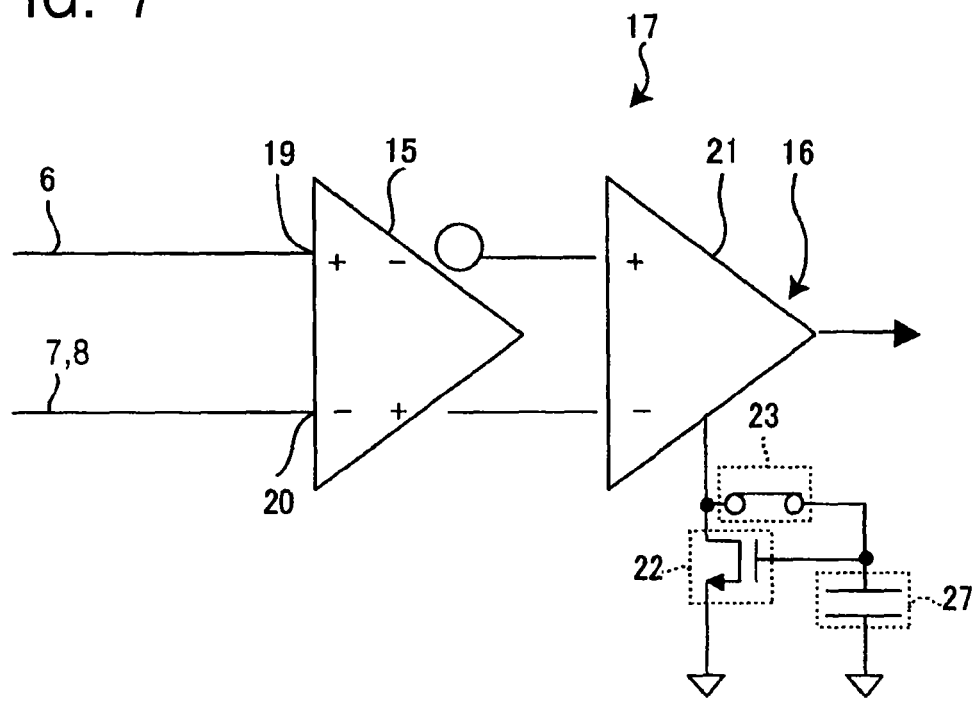
FIG. 7 is a schematic circuit diagram showing an amplifying unit (in a reset mode)
Figure 8:
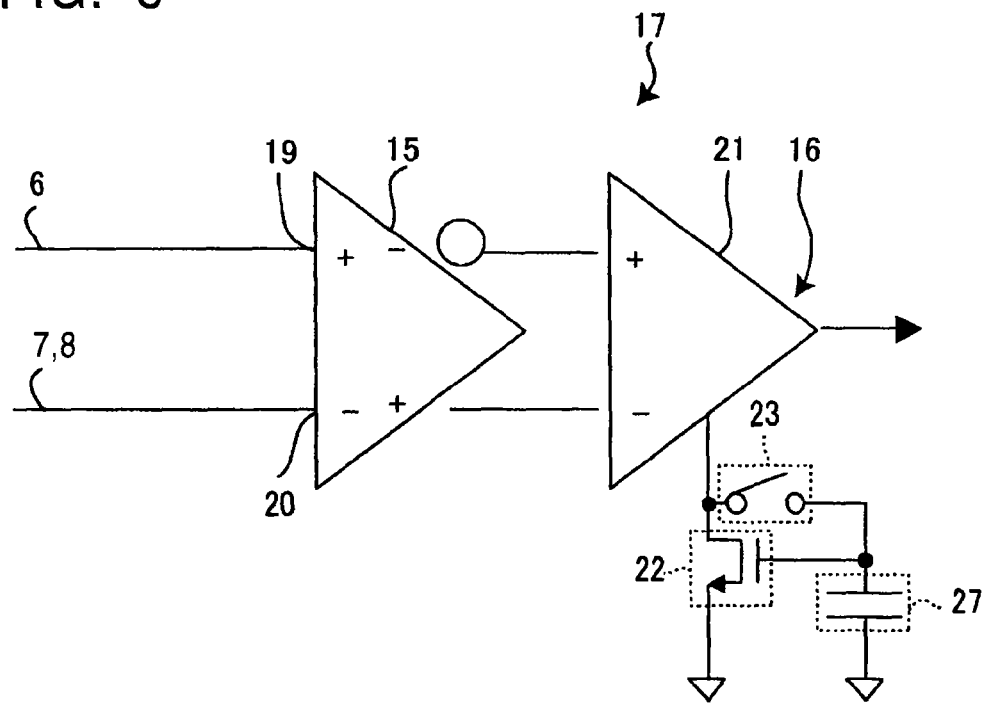
FIG. 8 is a schematic circuit diagram showing an amplifying unit (in a comparison mode)

As FIGS. 7 and 8 schematically show, ach two-stage amplifier 17 is formed by connecting the differential amplifiers 15 and 16. The differential amplifier 15 in the prestage is similar in configuration to each of the differential amplifiers C and D, into which the above comparators A and B are built. The differential amplifier 15 has an in-phase input terminal 19 to which the hold line 6 is connected, and an anti-phase input terminal 20 to which the upper-bit reference-signal line 7 (8) is connected.

The differential amplifier 16 in the poststage connects a load circuit 22 to a differential amplification circuit 21 and connects a load switching unit 23 to the load circuit 22. The differential amplifier 16 uses the load switching unit 23 to increase or reduce the gain of the differential amplification circuit 21 by switching between an entire load in which the entirety of the load circuit 22 is used as a load on the differential amplification circuit 21, and a partial load in which part of the load circuit 22 is used as a load on the differential amplification circuit 21.

Each two-stage amplifier 17 has an offset compressing function that superficially compresses an offset voltage of the differential amplifier 15 in the prestage by increasing the gain of the differential amplifier 16 in the poststage.

The specific structure of each two-stage amplifier 17 is described below with reference to FIG. 9.

The differential amplifier 15 is similar in configuration to each of the differential amplifiers C and D in which the above comparators A and B are built. The transistors T21 and T22 are cascode-connected to the output transistors T4 and T4'. In other words, the source terminals of the transistors T21 and T22 are respectively connected to the drain terminals of the transistors T4 and T4', and a predetermined bias voltage Vb1 is applied to the gate terminals of the transistors T21 and T22. This extracts the output of the differential amplifier 15 in the prestage from the drain terminals of the transistors T21 and T22.

An amplitude limiting unit 24 for limiting the amplitude of the output of the differential amplifier 15 is provided between the differential amplifier 15 in the prestage and the differential amplifier 16 in the poststage.

The steering sensor 24 includes load resistors R21 and R22 which are connected to the drain terminals of the transistors T21 and T22, respectively, and a resistor R30 connected between each of the resistors R21 and R22 and the ground GND. The load resistors R21 and R22 limit the amplitude of the output of the differential amplifier 15 in the prestage, and the resistor R30 adjusts a DC operating point of an input signal to the differential amplifier 16 in the poststage to an optimal voltage.

The differential amplifier 16 in the poststage includes cascode-connected P-type transistors T31, T41, T32, and T42 which are differentially connected to one another. The transistors T31 and T32 have gate terminals connected to the outputs (the drain terminals of the transistors T21 and T22) of the differential amplifier 15 in the prestage. A current supply I4 is connected between each source terminal of the transistors T31 and T32, and the source terminals of the transistors T41 and T42 are connected to the drain terminals of the transistors T31 and T32. A predetermined bias voltage Vb2 is applied to each gate terminal of the transistors T41 and T42, and an identical phase output terminal 25 and an opposite phase output terminal 26 are connected to the drain terminals of the transistors T41 and T42.

In the differential amplifier 16 in the poststage, cascode-connected N-type transistors T61, T71, T62, and T72 are connected to the cascode-connected P-type transistors, which form differential pairs, and switching transistors T51 and T52 are connected in parallel to one pair of the transistors T61 and T62 among the cascode-connected transistors T61, T71, T62, and T72, and the switching transistors T51 and T52 are connected in series to the other pair of the transistors T71 and T72.

In other words, the drain terminals of the transistors T61 and T62 are respectively connected to the drain terminals of the transistors T41 and T42. The transistors T61 and T62 have gate terminals, to which a predetermined bias voltage Vb3 is applied, and source terminals respectively connected to the drain terminals of the transistors T71 and T72. The transistors T71 and T72 have source terminals connected to the ground. The drain terminals of the transistors T51 and T52 are connected to the drain terminals of the transistors T41 and T42 in parallel to the transistors T61 and T62. The transistors T51 and T52 have gate terminals to which the clock signal CLK is applied, and source terminals to which the gate terminals of the transistors T71 and T72 are connected in series.

In the differential amplifier 16 in the poststage, the cascode-connected transistors T61, T71, T62, and T72 constitute the load circuit 22, and the switching transistors T51 and T52 as switching elements constitute the load switching unit 23.

When the switching transistors T51 and T52 are off, in the differential amplifier 16 in the poststage, the entirety of the load circuit 22 is used as a load (entire load). In this case, the load is a cascode load formed by the cascode-connected transistors T61, T71, T62, and T72, and decreases, thus increasing the gain of the differential amplifier 16 in the poststage. Also, when the switching transistors T51 and T52 are on, part of the load circuit 22 is a load (partial load). In this case, the load is a diode load formed by the transistors T71 and T72, and increases, thus reducing the gain of the differential amplifier 16 in the poststage.

In the differential amplifier 16 in the poststage, among the cascode-connected transistors T61, T71, T62, and T72, the transistors T71 and T72, which form the diode load, connect to capacitors C11 and C12 (as a voltage holding unit 27) which hold voltages applied in the case of the diode load. Specifically, the capacitor C11 is connected between the gate terminal of the transistor T71 and the ground GND and the capacitor C12 is connected between the gate terminal of the transistor T72 and the ground GND.

Next, the operation of the two-stage amplifier 17 is described below.

The two-stage amplifier 17 alternately repeats a reset mode in which the voltage of the analog signal is applied to the in-phase input terminal 19 and the anti-phase input terminal 20 in the differential amplifier 15 in the prestage by using the control signals CLK 1 and CLK3 to set the first and third switching units to be on and using the second control signal CLK2 to set the second switching unit to be off, and a comparison mode in which the voltage of the analog signal is applied to the anti-phase input terminal 20 in the differential amplifier 15 in the prestage by using the first and third control signals CLK1 and CLK3 to set the first and third switches to be off and using the second control signal CLK2 to the second switching unit to be on.

In the reset mode, the load switching unit 23 (the switching transistors T51 and T52) is set to be on, causing the load on the differential amplifier 16 in the poststage to be formed by the diode load, whereby the gain of the differential amplifier 16 in the poststage can be reduced. In the comparison mode, the load switching unit 23 (the switching transistors T51 and T52) is set to be off, causing the load on the differential amplifier 16 in the poststage to be formed by the cascode load, whereby the gain of the differential amplifier 16 in the poststage can be increased. In other words, in the two-stage amplifier 17, the gain of the differential amplifier 16 in the poststage is greater in the comparison mode than in the reset mode.

As described above, by increasing the gain of the differential amplifier 16 in the poststage, the two-stage amplifier 17 can superficially compress the offset voltage of the differential amplifier 15 in the prestage.

In other words, when the offset voltage of the differential amplifier 15 in the prestage is represented by $V_{os}$, the gain of the differential amplifier 15 in the reset mode (diode load mode) is represented by $G_r$, the gain of the differential amplifier 15 in the comparison mode (cascode load mode) is represented by $G_c$, the output voltage of the differential amplifier 15 is represented by $V_{out}$, and an input voltage in the comparison mode is represented by $V_{in}$, the output voltage $V_{out}$ in the reset mode is represented by $$V_{out} = G_r \cdot V_{os}$$

Also, the output voltage $V_{out}$ in the comparison mode is represented by $$V_{out} = G_c \cdot V_{in}$$

Therefore, an equivalent input offset of the two-stage amplifier 17 can be represented by $$V_{os} \cdot G_r / G_c$$

From the equivalent input offset, it is found that, in the two-stage amplifier 17, the offset voltage of the differential amplifier 15 is compressed $G_r/G_c$ times.

Accordingly, by reducing a gain ratio ($G_r/G_c$) by reducing the gain $G_r$ in the reset mode and increasing the gain $G_c$ in the comparison mode, an offset compressing effect of the two-stage amplifier 17 can be enhanced, thus increasing the accuracy of the comparison mode.

Figure 9:
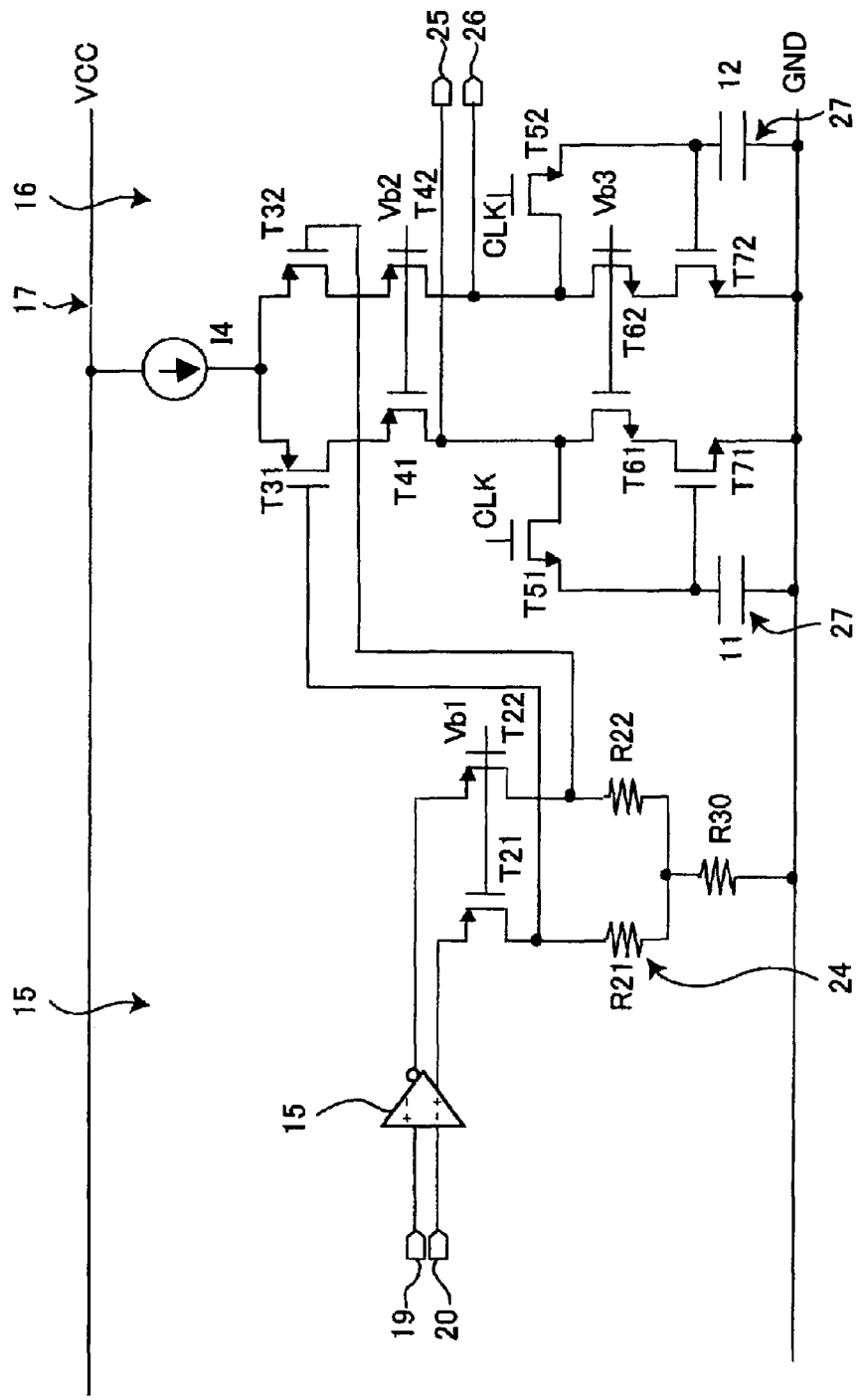
FIG. 9 is a circuit diagram showing an amplifying unit.

In the two-stage amplifier 17 shown in FIG. 9, the gain $G_r$ in the reset mode is represented by $$G_r = A \cdot gm1/gm2$$

where A represents the gain of the differential amplifier 15 in the prestage, gm1 represents the transconductance of the transistors T31 and T32, and gm2 represents the transconductance of the transistors T71 and T72. Thus, to further reduce the gain $G_r$ in the reset mode, the transconductance gm2 of the transistors T71 and T72 may be increased while reducing the transconductance of the transistors T31 and T32. Accordingly, in the two-stage amplifier 17 shown in FIG. 9, based on physical properties, P-channel transistors having a small transconductance are used as the transistors T31 and T32, and N-channel transistors having a large transconductance are used as the transistors T71 and T72. The operating speed in the reset mode and the comparison mode is dominantly determined by the transconductance gm2 of the transistors T71 and T72. Thus, an increase in the transconductance gm2 of the transistors T71 and T72 enables a high speed operation.

Figure 10:
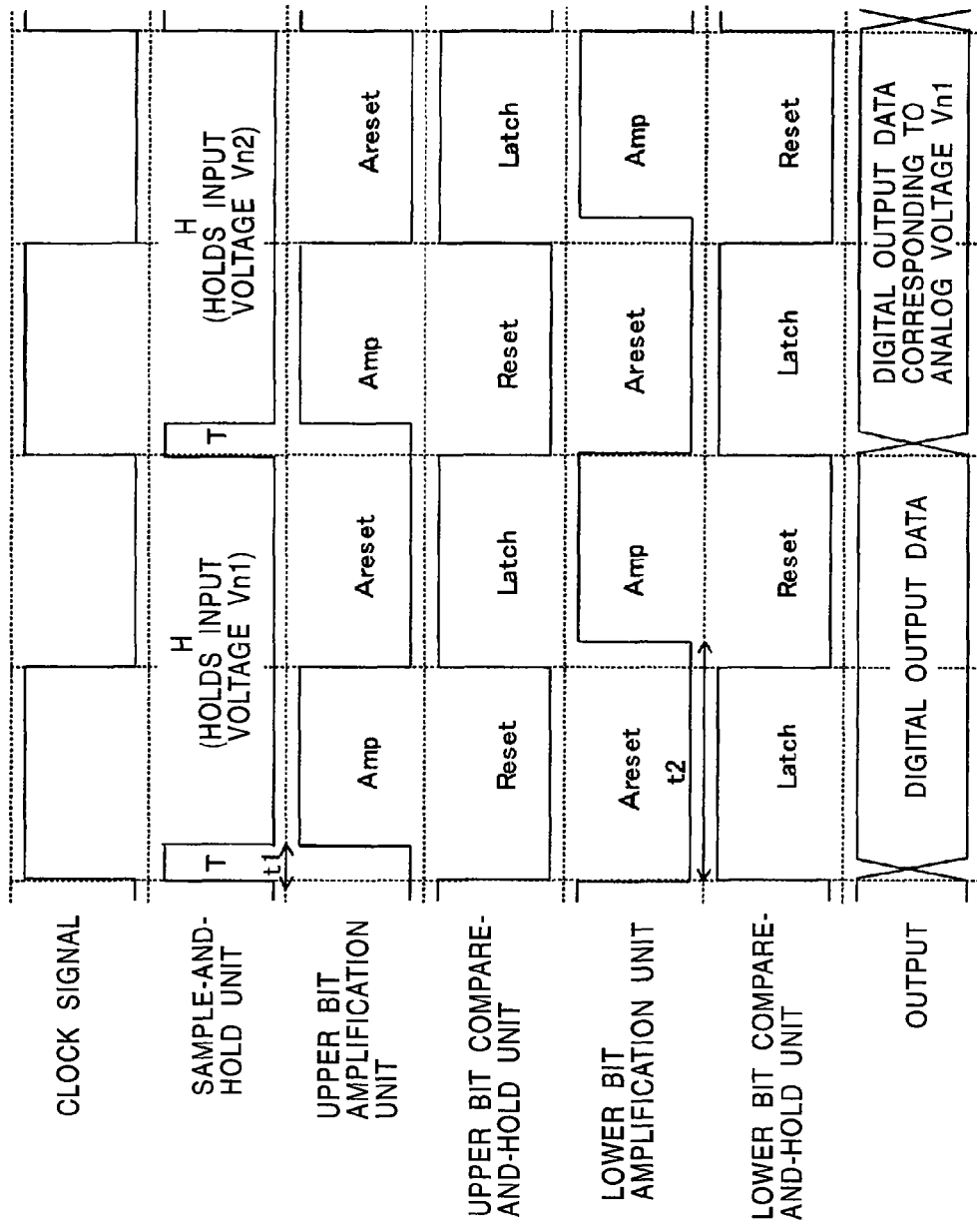
FIG. 10 is a timing chart showing the operation of an analog-to-digital converter.

Next, the operation of the analog-to-digital converter 1 is described below with reference to FIG. 10.

The analog-to-digital converter 1 can operate in synchronization with the clock signal CLK.

The sample-and-hold unit 2 samples the analog signal within a predetermined period (T) in synchronization with a rise of the clock signal CLK, and subsequently holds the sampled analog signal within a predetermined period (H) until the clock signal CLK rises next.

The amplification unit 13 for the upper bits is switched from the reset mode to the comparison mode after a predetermined time (t1) from the rise of the clock signal CLK and amplifies the voltage difference between the voltage of the analog signal held by the sample-and-hold unit 2 and the reference voltage, and is switched again from the comparison mode to the reset mode in synchronization with a rise of the clock signal CLK.

The compare-and-hold unit 14 for the upper bits is reset in synchronization with the rise of the clock signal CLK, and holds the output of the amplification unit 13 in synchronization with a fall of the clock signal CLK.

The logic processing unit 5 generates upper bit digital signals by performing logic processing on the output held by the compare-and-hold unit 14 for the upper bits, and the reference voltage generating unit 3 generates the reference voltages for the lower bits.

Also, the amplification unit 13 is switched from the reset mode to the comparison mode after a predetermined time (t2) from a rise of the clock signal CLK and amplifies the voltage difference between the voltage of the analog signal held by the sample-and-hold unit 2 and the reference voltage, and is switched again from the comparison mode to the reset mode in synchronization with the rise of the clock signal CLK.

The compare-and-hold unit 14 is reset in synchronization with a fall of the clock signal CLK, and holds the output of the amplification unit 13 in synchronization with a rise of the clock signal CLK.

The logic processing unit 5 generates lower bit digital signals by performing logic processing on the output held by the compare-and-hold unit 14, and outputs digital signals, which corresponds the analog signal, after one clock of the clock signal CLK.

Figure 11:
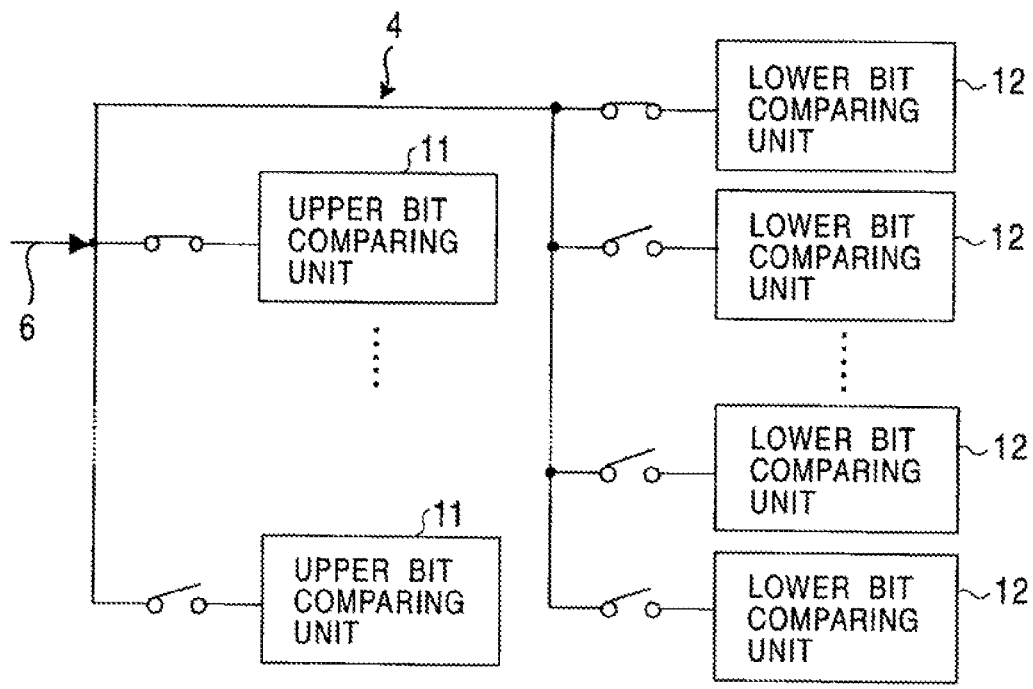
FIG. 11 is a circuit diagram showing another amplifying unit.
Figure 12:
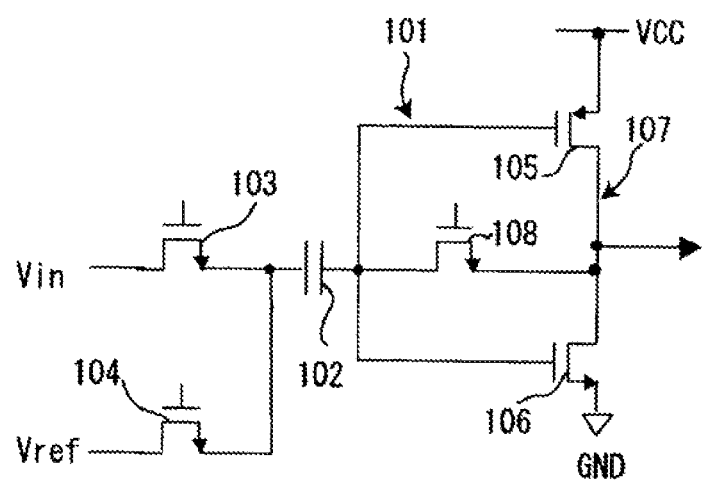
FIG. 12 is a circuit diagram showing a comparator of the related art.

As shown in FIG. 6, in the analog-to-digital converter 1, the comparing unit 4 includes one upper bit comparing unit 11 and one lower bit comparing unit 12. As shown in FIG. 11, the comparing unit 4 can achieve an increase in the speed of the analog-to-digital converter 1 by using a plurality of upper bit comparing units 11 each including one or more sample-and-hold units and a plurality of lower bit comparing units 12 each including a sample-and-hold unit which are connected in parallel to the hold signal line 6 from the sample-and-hold unit 2 by switches, and sequentially operating the upper bit comparing units 11 and the lower bit comparing units 12. For example, by alternately operating comparing units that operate at two sampling frequencies of 100 mega-samplings/second (MS/s), the analog-to-digital converter 1 can operate at 200 MS/s.

As described above, the differential amplifier 16 can increase or reduce the gain of the differential amplification circuit 21 by connecting the load circuit 22 to the differential amplification circuit 21 and connecting the load switching unit 23 to the load circuit 22, and using the load switching unit 23 to switch between the entire load in which the entirety of the load circuit 22 is used as the load on the differential amplification circuit 21 and the partial load in which part of the load circuit 22 is used as the load on the differential amplification circuit 21.

Accordingly, the circuit size of the load circuit 22 in the differential amplifier 16, whose gain is variable, can be reduced as much as possible.

Also, the load circuit 22 includes the cascode-connected transistors T61, T71, T62, and T72, and has the cascode load as the entire load and the diode load as the partial load. Thus, the load circuit 22 has a simplified configuration causing inexpensiveness, and has reduced size.

In particular, the load circuit 22 is constituted by the cascode-connected transistors T61, T71, T62, and T72, and the load switching unit 23 is formed by a switching element having connection in parallel to one pair of the transistors T61 and T62 among the cascode-connected transistors T61, T71, T62, and T72, and connection in series to the other pair of the transistors T71 and T72, whereby the switching element is set to be on, thus setting the load on the differential amplification circuit 21 to be a diode load. Also, by setting the switching element to be off, the load on the differential amplification circuit 21 is set to be a cascode load. Thus, the differential amplifier 16 has a simplified configuration causing inexpensiveness, and the circuit size of the differential amplifier 16 can be reduced as much as possible.

Since, among the cascode-connected transistors T61, T71, T62, and T72, the transistors T71 and T72, which form the diode load, connect to voltage holding units 27 for holding a voltage applied in the case of the diode load. Even an increase or decrease in the differential amplifier 16 does not change the DC operating point of the differential amplification circuit 21, and the differential amplifier 16 can be stably operated at high speed.

In addition, as described above, the two-stage amplifier 17 includes two differential amplifiers 15 and 16 which are connected in series to each other, and can increase the gain of the differential amplifier 16 in the poststage.

Accordingly, the two-stage amplifier 17 has an offset compressing function that compresses the offset voltage of the differential amplifier 15 in the prestage. The offset compressing function can increase the accuracy of the two-stage amplifier 17.

In addition, the two-stage amplifier 17 has a further improved offset compressing function because the differential amplifier 16 in the poststage is constituted by P-channel transistors, and the cascode-connected transistors T61, T71, T62, and T72 are formed by N-channel transistors.

Also, the amplitude limiting unit 24 for limiting the amplitude of the output of the differential amplifier 15 is provided between the differential amplifier 15 in the prestage and the differential amplifier 16 in the poststage. Thus, the amplitude limiting unit 24 can prevent a large amplitude signal from being input to the differential amplifier 16 in the poststage. This enables an increase in response speed.

As described above, the analog-to-digital converter 1 includes the amplification unit 13 having a sample-and-hold function, and uses the amplification unit 13 to convert the analog signal into a digital signal by amplifying a difference between the voltage of the analog signal and each of different reference voltages.

The analog-to-digital converter 1 is formed as a sub-ranging analog-to-digital converter that converts an analog signal in order from upper bits of digital signals by amplifying the difference between the voltage of the analog signal and each reference voltage while gradually narrowing the range of the reference voltages. Thus, the number of the amplification units 13 can be reduced. This enables an increase in the processing speed of the analog-to-digital converter 1 and a reduction in power consumption of the analog-to-digital converter 1.

Also, each amplification unit 13 includes a plurality of two-stage amplifiers 17 each formed by two differential amplifiers which are connected in series to each other, and complementary amplifiers 18 which are connected to the differential amplifiers 15 before the stage of adjacent two-stage amplifiers 17 and which differentially amplify the outputs of the differential amplifiers 15 in the prestage, whereby the amplification unit 13 is formed as a complementary analog-to-digital converter. Thus, the number of amplification units 13. This enables an increase in the processing speed of the analog-to-digital converter 1 and a reduction in power consumption of the analog-to-digital converter 1.

In addition, since each two-stage amplifier 17 has an offset compressing function that compresses the offset voltage of the differential amplifier 15 in the prestage by increasing the gain of the differential amplifier 16 in the poststage, the accuracy of the two-stage amplifier 17 can be increased. This can increase a resolution of the analog-to-digital converter 1. The transistors T11 and T12 on the input side of the differential amplifier 15 in the prestage are reduced in size, thus reducing the parasitic capacitances of the transistors T11 and T12, which are directly connected to the sample-and-hold unit 2. Thus, also this can increase the processing speed of the analog-to-digital converter 1, and can reduce the power consumption of the analog-to-digital converter 1.

In particular, when an amplifier having an offset compressing function is used as an amplifier for an apparatus requiring a plurality of amplifiers as in the case of the analog-to-digital converter 1, not only the offset voltage of each amplifier can be compressed, but also individual difference in offset voltage of the amplifiers can be decreased as much as possible, thus increasing the apparatus accuracy.

Since the differential amplifier 15 in the prestage includes a differential amplification circuit composed of the transistors T11, T21, T12, and T22, gate-drain mirror capacitance and drain-ground parasitic capacitance can be eliminated. Also this can increase the processing speed of the analog-to-digital converter 1, and can reduce the power consumption of the analog-to-digital converter 1.

The differential amplifier 16 can increase or reduce the gain of the differential amplification circuit 21 by connecting the load circuit 22 to the differential amplification circuit 21 and connecting the load switching unit 23 to the load circuit 22, and using the load switching unit 23 to switch between the entire load in which the entirety of the load circuit 22 is used as the load on the differential amplification circuit 21 and the partial load in which part of the load circuit 22 is used as the load on the differential amplification circuit 21. Thus, the load circuit 22 in the differential amplifier 16, whose gain is variable, has circuit size reduced as much as possible. Also this can reduce the power consumption of the analog-to-digital converter 1.

Although the above embodiment describes an example of a sub-ranging analog-to-digital converter which has a total of four bits and which performs conversion two separate times, the embodiment is not limited to the example of the sub-ranging analog-to-digital converter, but may be an analog-to-digital converter having a configuration for performing conversion in a plurality of stages. The analog-to-digital converter 1 is not limited to a single input analog-to-digital converter, but may be a differential input analog-to-digital converter. In addition, specific circuits are not limited to those having only positive supplies, but may be those having positive and negative supplies and those having only negative supplies. Also, specific elements constituting the circuits may be selected as required.

What is claimed is:

1. An analog-to-digital converter comprising a plurality of comparators, with each comparator including:
a sampling capacitor having an input and an output;
a first switching unit connected to the input of said sampling capacitor, said first switching unit applying an input signal to the input end of said sampling capacitor;
a second switching unit connected to the input of said sampling capacitor, said second switching unit applying a reference signal to the input end of said sampling capacitor;
an output transistor having a gate terminal connected to the output of said sampling capacitor in a source follower connection manner or an emitter follower connection manner, a source terminal connected to a constant current source and a drain terminal connected to ground;
a third switching unit connected to the output of said sampling capacitor; and a fourth switching unit connected in series between the third switching unit and ground, the fourth switching unit being common to at least two of the plurality of comparators;
wherein,
the input signal is converted into digital form after each of the comparators compares the input signal with the reference signal,
said third switching unit and fourth switching unit maintain a ground voltage at the output of said sampling capacitor during sampling and are selected such that a reverse current flowing through the third and fourth switching units and into the output of the capacitor is prevented,
the input signal is compared with the reference signal, and
said first switching unit, said second switching unit, said third switching unit and said fourth switching unit comprise transistors.

2. An analog-to-digital converter according to claim 1, wherein the input signal is compared with the reference signal by setting said first switching unit, said third switching unit and said fourth switching unit to be on and said second switching unit to be off, and subsequently setting said first switching unit, said third switching unit and said fourth switching unit to be off and said second switching unit to be on.

3. An analog-to-digital converter according to claim 1, wherein the input signal is compared with the reference signal by setting said first switching unit, said third switching unit and said fourth switching unit to be on and said second switching unit to be off, and subsequently setting said first switching unit, said third switching unit and said fourth switching unit to be off and said second switching unit to be on.

* * * * *